US005478695A

United States Patent [19]

Leenders

[11] Patent Number: 5,478,695

[45] Date of Patent: *Dec. 26, 1995

[54] HEAT-SENSITIVE IMAGING ELEMENT

[75] Inventor: Luc Leenders, Herentals, Belgium

[73] Assignee: AGFA-Gevaert, N.V., Mortsel, Belgium

[ * ] Notice: The term of this patent shall not extend beyond the expiration date of Pat. No. 5,360,781.

[21] Appl. No.: 155,223

[22] Filed: Nov. 22, 1993

[30] Foreign Application Priority Data

Dec. 8, 1992 [EP] European Pat. Off. .............. 92203803

[51] Int. Cl.[6] .......................... G03C 1/805; G03F 7/075; G03F 7/11

[52] U.S. Cl. .......................... 430/259; 430/201; 430/254; 430/262; 430/271; 430/272; 430/273; 430/302; 430/945

[58] Field of Search .................................... 430/271, 300, 430/309, 302, 273, 272, 945, 254, 259, 262, 201; 101/467, 453, 465, 463.1, 471

[56] References Cited

U.S. PATENT DOCUMENTS 5,262,275 11/1993 Fan .......................................... 430/273
5,340,693 8/1994 Uytterhoeven et al. ................ 430/259
5,360,781 11/1994 Leenders et al. ........................ 430/945

FOREIGN PATENT DOCUMENTS 55-132293 10/1980 Japan .................................... 101/467
2042749 9/1980 United Kingdom .................. 430/945
2200323 8/1988 United Kingdom .................. 101/453
92/07719 5/1992 WIPO .................................... 101/467

OTHER PUBLICATIONS

Patent & Trademark Office English–Language Translation Of Japanese Patent 55–132293 (Pub Oct. 14, 1980).

*Primary Examiner*—Janis L. Dote
*Attorney, Agent, or Firm*—Breiner & Breiner

[57] ABSTRACT

Heat-sensitive imaging element comprising a support carrying a binder layer, optionally an intermediate adhesive layer, and and a barrier layer that is ablatable by a laser beam or permeabilizable under the influence of a laser beam, wherein said binder layer contains at least one hydrophobizing agent capable of diffusing under the influence of heat through holes made in said barrier layer or through permeabilized parts of said barrier layer and capable of reacting with the oleophobic surface of a printing plate precursor brought in face-to-face contact with said barrier layer. The present invention also relates to a process for producing a lithographic printing plate, wherein use is made of such heat-sensitive imaging element.

9 Claims, No Drawings

HEAT-SENSITIVE IMAGING ELEMENT

FIELD OF THE INVENTION

The present invention relates to a heat-sensitive imaging element and to a process for producing a lithographic printing plate in a dry manner by means of said imaging element.

BACKGROUND OF THE INVENTION

Lithography is the process of printing from specially prepared surfaces, some areas of which are capable of accepting lithographic ink, whereas other areas, when moistened with water, do not accept ink. The areas accepting ink are the printing areas and the ink-rejecting areas are the background areas.

Common materials employed for making a lithographic printing material include photographic materials e.g. photosensitive polymer materials or silver salt diffusion transfer reversal (DTR) materials. For instance, in GB 547,795 and GB 891,898 processes for the production of a lithographic printing plate have been described, which comprise exposing to light under a pattern a plate having a hydrophilic base bearing a light-sensitive coating of a material capable of being hardened where exposed to visible light, inducing hardening of the said material in the light-struck areas to form an insoluble resist in such areas, selectively removing the unhardened portions of the coating from the base, applying to the entire surface of the plate an oleophilic—i.e. ink-accepting—film, and selectively removing the resist and the oleophilizing product adhering thereto from the light-struck areas to restore water-receptive, non-printing portions. U.S. Pat. No. 3,260,198 describes the use of a silver layer applied image-wise e.g. by the DTR-process to a hydrophilic layer essentially consisting of at least one metal of the group consisting of aluminium and zinc to protect the underlying hydrophilic layer from being oleophilized, after which the silver image layer is removed by treating the plate with a silver oxidizing agent, thus image-wise uncovering the hydrophilic layer. However, such photographic materials have the disadvantage that they often require strictly controlled ambient conditions before processing and a laborious or time-consuming treatment, and/or that they are ecologically or toxically harmful owing to the use of liquid processing baths. Furthermore, photographic materials that can be developed without the use of liquid processing baths often suffer from the additional disadvantage of being based on chemical compounds that are difficult to prepare.

Heat-sensitive materials recording machine-readable information have been described, in which materials by the thermal action of a high intensity laser beam pits or holes are burnt in a thin metallic film to optically record sound information in digital form. According to a common embodiment the information is stored in digital form on a spinning disk. After the recording a laser beam is used to read out the track of holes as a sequential pattern of light reflection values that are detected electronically. A system based on tellurium as ablatable metal has been described in e.g. Scientific American, August 1980, pages 118–120. The use in optical disk production of a thin layer of bismuth for high density direct read after write (DRAW) recording has been described in Optica Acta, (1977), vol. 24, No. 4, pages 427–431.

Another class of heat-sensitive materials recording human-readable information are e.g. computer output microfilm (COM) materials, the record of which can be read by optical enlargement in a reader upon projecting light through the COM record.

The local removal of a thin metal layer by burning holes has not been restricted to the direct production of optical density or light reflection patterns but has been applied like-wise according to e.g. the published PCT application WO 86/00575 for the production of a stencil that may serve for the production of dye images. According to said PCT application a radiation-sensitive article is provided having at least one vapour-deposited dye layer on the surface of a support and a vapour-deposited, graded metal/metal oxide or metal sulfide layer applied directly over the vapour-deposited dye layer. The dye layer or the metal layer may carry additional layers e.g. vapour-coated organic protective layers. An image can be formed on the graded metal/metal oxide or metal sulfide layers by ablation when struck by heat-generating light such as the light of a high intensity laser beam or of a flash lamp. The holes made in the graded metal/metal oxide or metal sulfide layer by ablation serve as the apertures of a stencil, through which dye can be transferred by heat onto a receptor element.

The image-wise ablation of a thin metal layer by laser light has also been described for the production of a lithographic printing plate. In JP 86046314 a material has been described, which comprises a support, an ink-oil-sensitive layer, and a chromium metal layer. A printing plate is made by directing laser light onto the material and thus removing the chromium metal layer. However, chromium, is known to be a very toxic element and, furthermore, its conductivity makes it less suitable for use as an ablative layer than e.g. bismuth. Moreover, the direct use of the imaging element as a lithographic printing plate may result in short run lengths on a lithographic press since increasing wear of the chromium areas leads to a decrease in hydrophilicity of the background areas.

The image-wise ablation of a metal layer of a heat-sensitive recording material by high intensity laser beam light has also been described in EP-A 489,9721. A dye or dye precursor can be transferred to a receptor element by heat and/or liquid through holes made in said metal layer by laser beam exposure.

SUMMARY OF THE INVENTION

It is an object of the present invention to provide a heat-sensitive imaging element having low toxicity and requiring low imaging energy.

It is another object of the present invention to provide a process for producing a lithographic printing plate in a dry and inexpensive manner by means of said heat-sensitive imaging element.

Further objects and advantages of the present invention will become clear from the description and examples hereinafter.

According to the present invention a heat-sensitive imaging element is provided, which comprises a support carrying in the given sequence a binder layer, optionally an intermediate adhesive layer, and a barrier layer that is ablatable by a laser beam or permeabilizable under the influence of a laser beam, wherein said binder layer contains at least one hydrophobizing agent capable of diffusing under the influence of heat through holes made in said barrier layer or through permeabilized parts of said barrier layer and capable of reacting with the oleophobic surface of a printing plate precursor brought in face-to-face contact with said barrier layer.

The present invention also provides a process for producing a lithographic printing plate, said process comprising the consecutive steps of:

(1) providing a heat-sensitive imaging element comprising a support carrying in the given sequence a binder layer containing at least one hydrophobizing agent, optionally an intermediate adhesive layer, and a barrier layer being impermeable to said hydrophobizing agent, (2) image-wise exposing said imaging element to a digitally modulated laser beam striking the barrier layer with such intensity that the barrier layer is locally displaced or locally removed by ablation or locally rendered permeable to said hydrophobizing agent, (3) bringing said image-wise exposed imaging element with its barrier layer side in face-to-face contact with an oleophobic surface of a printing plate precursor, (4) heating said imaging element while in contact with said oleophobic surface to allow said hydrophobizing agent to diffuse through the places where the barrier layer has been locally displaced or removed by ablation or rendered permeable onto said oleophobic surface to render said surface image-wise oleophilic, and (5) separating the resulting lithographic printing plate from said imaging element.

DETAILED DESCRIPTION OF THE INVENTION

The barrier layer of said heat-sensitive imaging element may be a metal layer composed of a single metal or of different metals forming an eutectic mixture or alloy as described in e.g. EP-A 294,173. The barrier layer may also be a layer composed of at least one inorganic metallic substance e.g. a metal sulfide or of a mixture of such at least one inorganic metallic substance and at least one metal.

The ablatable metal barrier layer may be applied together with or may be covered with substances increasing the recording sensitivity e.g. substances that lower the light-reflectivity and improve the absorption of laser light. Examples of such substances are the metal oxides, sulfides, and halides described in e.g. GB-A 2,036,597. GeS and SnS are preferred for that purpose and they can be used in a thickness—depending on the wavelength of the recording laser light—of e.g. 5 to 100 nm as an anti-reflection layer that does not disturb the ablation of the ablatable metal layer.

The metals or inorganic metallic substances employed in said barrier layer preferably have a low toxicity. Preferably, they can be easily vapour-deposited under vacuum conditions to form a metal barrier layer or film, and need little energy for being ablated by fusion or evaporation. Most preferred metals are indium, tin, and bismuth.

According to a particular embodiment the metal barrier layer may consist of different superposed metals and/or inorganic metallic substances.

The barrier layer of said heat-sensitive imaging element—instead of being a metal barrier layer—can also be any layer that is impermeable to said hydrophobizing agent so that transfer of said hydrophobizing agent is substantially inhibited at the non-exposed parts during the heating of said imaging element while in contact with said oleophobic surface.

The barrier layer can be e.g. a polymer layer and in that case it may comprise at least one polymer chosen from e.g. hardened silicone resin, gelatin, cellulose, cellulose esters such as e.g. cellulose acetate, cellulose nitrate, polyvinyl alcohol, polyvinyl pyrrolidone, a copolymer of vinylidene chloride and acrylonitrile, poly(meth)acrylates, polyvinyl chloride, and a copolymer of styrene and butadiene. When the barrier layer is a polymer layer, it should also comprise substances that absorb the light emitted by the laser beam and convert it into heat so that as a result of this heat ablation or permeabilization can take place locally in the barrier layer.

Suitable-substances capable of converting light emitted by the laser beam into heat are e.g. infrared-absorbing or near infrared-absorbing dyes or pigments, and carbon black. Suitable infrared-absorbing dyes are disclosed in e.g. U.S. Pat. No. 4,833,124, EP-321,923, U.S. Pat. No. 4,772,583, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,912,083, U.S. Pat. No. 4,952,552, U.S. Pat. No. 5,024,990, and U.S. Pat. No. 5,023,229. Suitable infrared-absorbing pigments are e.g. HEUCODOR metal oxide pigments available from Heubach Langelsheim.

Suitable silicone resins for use in the barrier layer of the heat-sensitive imaging element of the present invention preferably contain one or more components, one of which generally is a linear silicone polymer having chemically reactive terminal groups at both ends and a multifunctional component as a hardening agent. The silicone resin can be hardened by condensation curing, addition curing, or radiation curing.

Condensation curing can be performed by using a hydroxy-terminated polysiloxane that can be cured with a multifunctional silane. Suitable silanes are e.g. acetoxy silanes, alkoxy silanes, and silanes containing oxime functional groups. Generally, the condensation curing is carried out in the presence of one or more catalysts such as e.g. tin salts or titanates. Alternatively, hydroxy-terminated polysiloxanes can be cured with a polyhydrosiloxane polymer in the presence of a catalyst e.g. dibutyl-tin diacetate.

Addition curing is based on the addition of Si—H to a double bond in the presence of a platinum catalyst. Silicone coatings that can be cured according to the addition curing thus comprise a vinyl polymer, a platinum catalyst e.g. chloroplatinic acid complexes, and a polyhydrosiloxane e.g. polymethylhydrosiloxane. Suitable vinyl polymers are e.g. vinyldimethyl-terminated polydimethylsiloxanes and dimethylsiloxane/vinylmethyl siloxane copolymers.

Radiation cure coatings that can be used in accordance with the present invention are e.g. U.V.-curable coatings containing polysiloxane polymers containing epoxy groups or electron beam-curable coatings containing polysiloxane polymers containing (meth)acrylate groups. The latter coatings preferably also contain multifunctional (meth)acrylate monomers.

The optimal composition of the barrier layer can be easily determined with routine experiments and will be determined by such factors like the operating temperature during transfer, decomposibility of the barrier layer, and the type of hydrophobizing agent used.

The barrier layer has to be sufficiently thick and of high uniformity so as to prevent the removal of underlying hydrophobizing agent by heat due to thermosublimation or thermal melting during heat processing. In case the barrier layer is a metal barrier layer the thickness thereof preferably does not exceed 1 μm and more preferably ranges from 0.01 μm to 0.8 μm. In case the barrier layer is a polymer barrier layer the thickness thereof ranges from 0.01 μm to 2 μm.

The ablatable metal barrier layer is applied preferably by vapour deposition under vacuum. For example, the coating of a bismuth layer by vapour deposition proceeds under a reduced pressure of $10^{-2}$ Pa to 8×10−1 Pa as described in EP-A 384,041.

Optionally, the barrier layer—whether it is a metal barrier layer or a polymer barrier layer—may be covered with a layer that protects it from mechanical wear. A suitable protective layer is e.g. a silicone resin layer. If desired, the protective layer can be removed integrally after the image-wise exposure so that during the overall heating step the diffusion of the hydrophobizing agent to the oleophobic surface is facilitated. The removal of the protective layer can be performed in different ways e.g. by rubbing off or by sticking an adhesive-tape onto the protective layer and tearing the tape off together with the protective layer sticking thereto. Alternatively, it is possible also to bring about a reduction in adherence of the protective layer during the image-wise exposure so that at the image-wise exposed areas the protective layer is removable by rubbing or tearing off e.g. tearing off by means of a tape pressed against the protective layer.

Hydrophobizing agents are frequently used in the art of lithography for increasing the hydrophobicity of the printing areas. The hydrophobizing agents for use in the binder layer of the heat-sensitive imaging element of the present invention have to be chosen depending on the nature of the oleophobic surface of the printing plate precursor.

When the oleophobic surface of the printing plate precursor is an aluminium surface the hydrophobizing agents can be chosen from at least one representative of the group consisting of 1,2-dihydroxyaryl compounds, 1,3-diketones, o-hydroxy-anilines, dicarboxylic acids, and 8-hydroxyquinoline derivatives. Typical examples are 3,4-dihydroxybiphenyl, 1,2-naphthoquinone, 1-phenyl-1,3-butanedione, 2-acetyl-acetophenone, palmitic acid, nicotinamide, and 8-hydroxyquinoline. Another preferred class of hydrophobizing agents are the polymeric substances described by S. Ethan e.a. in J. of Applied Polymer Science 42 (1991) 2893.

When the oleophobic surface of the printing plate precursor is a silver or bismuth surface the hydrophobizing agents generally are alkyl or aryl mercaptans or more preferably heterocyclic mercaptans. Suitable hydrophobizing agents of the heterocyclic mercaptan type are e.g. 2-mercapto-1,3,4-oxadiazole derivatives as described in e.g. U.S. Pat. No. 3,776,728 and 3-mercapto-1,2,4-triazoles. Preferred hydrophobizing agents of the heterocyclic mercapto type are e.g. 2-mercapto-5-heptyl-1,3,4-oxadiazole and 4-phenyl-3-mercapto- 5-tridecyl-1,2,4-triazole.

The binder in said binder layer containing at least one hydrophobizing agent is a polymeric compound of such nature that it allows said hydrophobizing agent(s) to leave said binder layer at the laser beam-exposed places of the imaging element upon heat processing and diffuse to the printing plate precursor. The binder may be soluble in aqueous or in organic medium. A hydrophilic polymer binder for incorporating the at least one hydrophobizing agent in the binder layer of the heat-sensitive imaging element according to the present invention is gelatin. The gelatin can be lime-treated or acid-treated gelatin. The preparation of such gelatin types has been described in e.g. "The Science and Technology of Gelatin", edited by A. G. Ward and A. Courts, Academic Press 1977, page 295 and following. The gelatin can also be an enzyme-treated gelatin as described in Bull. Soc. Sci. Phot. Japan, No 16, page 30 (1966).

Gelatin can, however, be replaced in part or integrally by synthetic, semi-synthetic, or natural polymers either or not applied in dissolved or dispersed (latex) form. Synthetic substitutes for gelatin are e.g. polyvinyl alcohol, poly-N-vinyl pyrrolidone, polyacrylamide, polyacrylic acid and copolymers thereof. Natural substitutes for gelatin are e.g.

other proteins such as zein, albumin, and casein, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroalkyl cellulose, carboxymethyl cellulose, phthaloyl cellulose, and cellulose sulphates.

Latex polymers, which are polymer particles dispersed in aqueous medium, can be used in admixture with the hydrophilic polymer binder e.g. with gelatin. Useful latex polymers are polymers known for forming a subbing layer as described in U.S. Pat. No. 3,649,336. Examples of such latex polymers are copolymers of vinylidene chloride e.g. copolymers of vinylidene chloride with acrylic acid ester monomers and minor amounts of vinyl monomers containing carboxylic acid groups e.g. acrylic acid and/or itaconic acid monomers.

Water-insoluble hydrophobic polymers that are soluble in organic solvent(s) and that may be applied as binder material for thermally transferable hydrophobizing agents are e.g. ethyl cellulose, cellulose nitrate, cellulose acetate formate, cellulose acetate hydrogen phthalate, cellulose acetate, cellulose acetate propionate, cellulose acetate butyrate, cellulose acetate pentanoate, cellulose acetate benzoate, cellulose triacetate, vinyl-type resins and derivatives e.g. polystyrene and copolymers e.g. copoly(styrene/acrylonitrile) and copoly(acrylonitrile/styrene/butadiene), polyvinyl acetate optionally partially hydrolyzed, copoly(vinyl chloride/vinyl acetate), polyvinyl butyral, copoly(vinyl butyral/vinyl acetal/vinyl alcohol), polyvinyl acetoacetal; polymers and copolymers of acrylic acid esters, e.g. polymethyl methacrylate and copoly(acrylate/styrene) resins; polyester resins; polycazbonates; polysulfones; polyphenylene oxide; organosilicones such as polysiloxanes; epoxy resins; natural resins such as gum arabic, and modified natural resin binders such as the modified dextrans described in EP-A 444,325.

It has been established that bismuth adheres sufficiently strongly to a binder-containing layer. The adhesion of other metals than bismuth to a binder-containing layer can be improved and the adhesion of bismuth to such layer may still be enhanced by providing between the metal barrier layer and said binder-containing layer a thin intermediate adhesive layer that is ablatable together with said metal layer or that has a sufficient permeability to allow transfer of the hydrophobizing agent through said intermediate adhesive layer under the influence of heat. Said intermediate adhesive layer preferably has a thickness lower than 5 μm and more preferably even lower than 1 μm.

The binder layer containing the hydrophobizing agent and said intermediate adhesive layer may be applied according to any coating technique known in the art of making thin binder layers.

The thickness of the binder layer containing the hydrophobizing agent is preferably in the range of 0.2 to 5 μm, and more preferably in the range of 0.4 to 2.0 μm. The weight ratio of hydrophobizing agent to binder preferably ranges from 9:1 to 1:9 and even more preferably from 2:1 to 1:5.

The support that is to carry the binder layer containing the hydrophobizing agent may be any kind of sheet, ribbon or web support. It can be made of e.g. metal, resin, paper, or combinations of these. Preferred is a flexible support made of synthetic resin e.g. a polyethylene terephthalate polyester resin support optionally subbed for improving the adherence thereto of said binder layer. Also preferred is a resin-coated paper support e.g. a corona-treated polyethylene-coated paper support.

In case the support is transparent to the laser beam the image-wise exposure of the imaging element to said laser beam can be performed through said support. Normally, however, the exposure is performed at the other side i.e. at the side showing the barrier layer.

The printing plate precursor for use as receptor element in the process of the present invention comprises or consists of any plate, sheet or foil commonly used in the lithographic printing art, provided that at least one integral surface of said printing plate precursor has been rendered oleophobic or is an oleophobic surface and said integral surface is capable of reacting with the image-wise diffusing hydrophobizing agent. Examples of plates, sheets or foils that can be oleophobized or that are oleophobic are paper sheets, polyester film sheets, which may have been coated with a hydrophilic layer as disclosed in e.g. U.S. Pat. No. 3,971,660, a paper sheet or polyethylene sheet, which may have been coated with a hydrophilic layer, a metallized polyester film sheet, and metallic foils of e.g. zinc or aluminium. Any metallic or metallized sheet or foil that is hydrophilic and is capable of reacting with the image-wise diffusing hydrophobizing agent is preferably used as printing plate precursor in the process of the present invention.

Thus, although a metallic foil of e.g. aluminium is hydrophilic in se, it may have to be provided with a supplemental continuous oleophobic layer or layer of oleophobic agents to render it capable of reacting satisfactorily with said diffusing hydrophobizing agent. Examples of such oleophobic agents or layers are bismuth or silver and layers thereof. A preferred continuous oleophobic metal layer is a layer of metallic silver. A continuous metal layer can be applied by vapour deposition or by vacuum deposition e.g. on an aluminium foil. Another method for applying a continuous metal layer to a plate, sheet, or foil comprises depositing metal salt complexes according to the silver salt DTR-process on said plate, sheet or foil in the presence of developing agents and preferably in the presence of physical development nuclei. The principles of the silver salt DTR-process have been described in e.g. U.S. Pat. No. 2,352,014 and more detailedly in "Photographic Silver Halide Diffusion Processes" by A. Rott and E. Weyde—The Focal Press—London and New York, (1972). The silver salt DTR-process is particularly suited for applying a continuous metallic silver layer to a plate, sheet or foil e.g. an aluminium foil.

A preferred printing plate precursor for use in the process of the present invention is an aluminium foil or an aluminium foil provided with an oleophobic continuous metallic silver layer.

In cases when the printing plate precursor has been provided with an oleophobic continuous metallic layer it may be advantageous—after formation of the oleophilic image on the oleophobic metal surface—to improve the legibility of the printing plate obtained. For that purpose the printing plate obtained can be treated with a bleaching liquid to remove the metal layer, preferably a silver metal layer, at the areas of the printing plate where no or insufficient reaction of the metal layer with the released hydrophobizing agent has taken place. The bleaching liquid comprises a bleaching agent, which in the case of a silver metal layer is a silver-bleaching agent e.g. an iron(III) salt or complex, iodine, hydrogen peroxide, and quinone. Preferably, an iron(III) complex is used. The treatment with a bleaching liquid may also improve the differentiation between the oleophilic and the oleophobic parts of the printing plate obtained, in other words between the image parts and the non-image parts.

The legibility of the printing plate can also be improved as a result of the use of at least one chromophoric group in the hydrophobizing agent, or as a result of incorporating into the layer comprising the hydrophobizing agent a thermally transferable dye being capable of diffusing to said oleophobic surface. Examples of suitable dyes can be found in e.g. U.S. Pat. No. 4,500,354 and EP-A 316,928.

Suitable aluminium foils for use in the process of the present invention are made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints. Sealing is not necessary but may still improve the printing results.

Graining of the aluminium surface can be carried out mechanically or electrolytically in any known way. The roughness produced by the graining is measured as a centre line average value expressed in μm and preferably varies from about 0.2 to about 1.5 μm.

The anodization of the aluminium foil can be performed in electrolytes e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.0 μm.

After the anodization step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. For that purpose the anodic surface of the aluminium foil can be rinsed with water having a temperature of 70°–100° C. or with steam. The hot sealing water may comprise additives e.g. nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. Pat. No. 3,861,917 and in the documents referred to therein.

According to an alternative embodiment of the imaging element of the present invention a strippable monosheet assemblage is provided, which comprises in the given order:

a printing plate precursor having an oleophobic surface as above described, a stripping layer, a barrier layer that is ablatable by a laser beam or permeabilizable under the influence of a laser beam, optionally an intermediate adhesive layer, a binder layer, and optionally a support, wherein said binder layer contains at least one hydrophobizing agent capable of diffusing under the influence of heat through holes made in said barrier layer or through permeabilized parts of said barrier layer and capable of reacting with the oleophobic surface of said printing plate precursor.

The stripping layer is a layer, which is permeable to hydrophobizing agent diffusing under the influence of heat and which upon completion of the heat processing and transfer, allows separation of the resulting printing plate carrying an oleophilic image from the other layers including said stripping layer.

The image-wise exposure of the strippable monosheet assemblage can be performed through the optional support and in this case, the support is a transparent synthetic resin film e.g. a polyethylene film, a cellulose acetate film, a polyethylene terephthalate film, or a polyvinyl chloride film and should have an adhesive power to the layer packet consisting of the binder layer, the optional intermediate adhesive layer, the barrier layer, and the stripping layer higher than the adhesive power of the stripping layer to said oleophobic surface of the printing plate precursor, so that after heat processing and transfer separation of said support carrying said layer packet from the printing plate is possible.

The image-wise exposure of the strippable monosheet assemblage can also be performed through the printing plate precursor and the stripping layer, which in that case are optically transparent to the laser beam. The printing plate precursor can then be e.g. a polyester or polyethylene film sheet carrying a hydrophilic layer. The optional support may not be present in this case so that after heat processing and transfer said layer packet has to be separated from the printing plate by mechanical means such as rubbing off. It may be easier, however, to provide the strippable monosheet assemblage with a said support, which support can then be used as a tool to facilitate the separation from the printing plate.

The strippable monosheet assemblage can be made by consecutively applying the following layers to a printing plate precursor having an oleophobic surface as above described: a said stripping layer, a said barrier layer, optionally an intermediate adhesive layer, a said binder layer, and optionally a support.

Alternatively, the strippable monosheet assemblage can be made by making a layer packet comprising a transparent synthetic resin film support coated consecutively with at least one adhesion-improving layer, a said binder layer, a said optional intermediate adhesive layer, a said barrier layer, and a said stripping layer, and at any desired moment laminating the latter layer packet with the side showing said stripping layer onto a printing plate precursor having an oleophobic surface as above described.

The recording of information with a heat-sensitive imaging element according to the present invention is preferably performed with a digitally modulated laser beam that strikes the metal layer with such intensity that it is locally displaced or removed by ablation. For example, a light energy dosis sufficient for ablating a 150 nm thick bismuth layer is in the range of 100 to 300 mW per 10 $\mu m^2$ at pixel times ranging from 500 to 50 ns. A Nd-YAG laser emitting at 1064 nm is particularly useful for this purpose.

The thermal diffusion of said hydrophobizing agent to the printing plate precursor is performed by heating said imaging element while in contact with said oleophobic surface of the printing plate precursor, the heat being supplied according to any suitable heating method e.g. by the use of a heating plate or body, heating rollers, or a hot drum. Alternatively, the material may be passed through a hot atmosphere or high frequency heating can be applied. Continuous or discontinuous heating can be used. The thermal diffusion of said hydrophobizing agent can be accomplished by heating said imaging element while in contact with said oleophobic surface to a temperature in the range of 80° to 200° C., preferably 100° to 175° C., for a period of from 1 to 180 s, preferably 3 to 60 s.

The thermal transfer of the hydrophobizing agent proceeds according to a convenient method by conveying the imaging element and the printing plate precursor while in contact with one another between pressure rollers, of which rollers at least the one contacting the back of the imaging element is heated to a temperature in the range of e.g. 80° to 150° C. An example of an apparatus suitable for carrying out thermal transfer has been described in U.S. Pat. No. 4,905,050.

According to an alternative inverse embodiment of the invention a heat-sensitive imaging element is provided, which comprises a support carrying in the given sequence a binder layer, optionally an intermediate adhesive layer, and a barrier layer that is ablatable by a laser beam or permeabilizable under the influence of a laser beam, wherein said binder layer contains at least one hydrophilizing agent capable of diffusing under the influence of heat through holes made in said barrier layer or through permeabilized parts of said barrier layer and capable of reacting with the oleophilic surface of a printing plate precursor brought in face-to-face contact with said barrier layer. A printing plate precursor having an oleophilic surface is a material having a surface of e.g. silver, copper, gold, and brass.

According to an inverse embodiment of the method of the present invention a process is provided for producing a lithographic printing plate, said process comprising the consecutive steps of:

(1) providing a heat-sensitive imaging element comprising a support carrying in the given sequence a binder layer containing at least one hydrophilizing agent, optionally an intermediate adhesive layer, and a barrier layer being impermeable to said hydrophilizing agent, (2) image-wise exposing said imaging element to a digitally modulated laser beam striking the barrier layer with such intensity that the barrier layer is locally displaced or locally removed by ablation or locally rendered permeable to said hydrophilizing agent, (3) bringing said image-wise exposed imaging element with its barrier layer side in face-to-face contact with an oleophilic surface of a printing plate precursor, (4) heating said imaging element while in contact with said oleophilic surface to allow said hydrophilizing agent to diffuse through the places where the barrier layer has been locally displaced or removed by ablation or rendered permeable onto said oleophilic surface to render said surface image-wise oleophobic, and (5) separating the resulting lithographic printing plate from said imaging element.

The present invention is illustrated by the following examples without limiting it thereto.

EXAMPLE 1

Three different imaging elements were prepared by coating different solutions for a binder layer on subbed polyethylene terephthalate supports having a thickness of 100 μm. Each coating solution comprised a binder, a hydrophobizing agent, and a solvent as identified in Table 1 hereinafter. The binder was either polyvinyl butyral (PVB in Table 1), which is sold under the trade mark BUTVAR B79 by Monsanto or a copoly(vinyl chloride/vinyl acetate) (VC/VA in Table 1), which is sold under the trade mark SOLVIC 560 RA by Solvay. Each coating solution was coated in such a way that 1.0 g of binder and 1.0 g of hydrophobizing agent was present on the support.

TABLE 1

| Binder layer of imaging element | | | | |
|---|---|---|---|---|
| imaging element N° | hydrophobizing agent | melting point | binder | solvent |
| 1 | palmitic acid | 63° C. | PVB | THF |
| 2 | palmitic acid | 63° C. | VC/VA | THF |
| 3 | 3,4-dihydroxy-biphenyl | 145° C. | VC/VA | MEK |

THF stands for tetrahydrofuran
MEK stands for methyl ethyl ketone

Next, a bismuth barrier layer was deposited by evaporation up to an optical density of about 4 on each of the above binder layers.

Each of the resulting imaging elements was subjected to ablative laser beam recording by striking the barrier layer pixelwise with a laser beam of a Nd-YAG laser emitting at 1064 nm. The laser spot projected on the barrier layer had a width of 6.5 μm at the $1/e^2$ value of the spot intensity peak. The power of the light energy striking the barrier layer was in the range of 110 to 180 mW and the writing proceeded with a pixeltime of 214 ns. By this exposure holes were burnt in the barrier layer.

Tree aluminium foils having a thickness of 0.15 mm, which had been grained electrochemically, anodized, and sealed, were used as printing plate precursors.

Each exposed imaging element was placed with its bismuth layer side in face-to-face contact with an above-mentioned aluminium foil and the resulting sandwich was conveyed for 2 s between heating rollers having a temperature of 100° C. After the heat treatment each imaging element was separated from the resulting printing plate.

The ink reception of each printing plate obtained was checked by making a test run of 100 prints on an offset printing press running with a commonly employed ink and fountain solution. The printing quality of the 100th print was evaluated.

In all tree cases the 100th print had a good ink reception and consequently showed a uniform black in the printed areas.

EXAMPLE 2

Different imaging elements were prepared by coating different solutions for a binder layer on subbed polyethylene terephthalate supports having a thickness of 100 μm. Each coating solution comprised 2-mercapto-5-heptyl-1,3,4-oxadiazole (MHO) as hydrophobizing agent, methyl ethyl ketone as solvent, and one of the following binders:

CSA Copoly(styrene/acrylonitrile)

CAB cellulose acetate butyrate (29.5% acetyl, 1,5% hydroxy, 17% butyryl)

VC/VA as defined in Example 1

PVB as defined in Example 1

Each coating solution was coated in such a way that 1.0 g of binder and either 0.3 g or 1.0 g of hydrophobizing agent was present on the support.

Next, a bismuth barrier layer was deposited by evaporation up to an optical density of 1.6 on each of the above binder layers.

Each of the resulting imaging elements was subjected to ablative laser beam recording as described in Example 1.

Tree aluminium foils having a thickness of 0.15 mm, which had been grained electrochemically, anodized, and sealed, were provided with an integral silver layer according to the DTR-process in such a way that 0.7 g of silver (calculated as silver nitrate) was present per m2. The resulting foils were used as printing plate precursors.

Each exposed imaging element was placed with its bismuth layer side in face-to-face contact with the silver layer of an above-mentioned aluminium foil and the resulting sandwich was conveyed for 2 s between heating rollers having a temperature of either 120° C. or 140° C. After the heat treatment each imaging element was separated from the resulting printing plate.

The ink reception of each printing plate obtained was checked by making a test run of 100 prints on an offset printing press running with a commonly employed ink and fountain solution. The printing quality of the 100th print was evaluated visually, one of the following values being attributable:

0 no ink reception at all 1 very poor ink reception resulting in a very light grey hue 2 poor ink reception resulting in a light grey hue 3 moderate ink reception giving a grey hue 4 black standing for good ink reception The results are given in the following Table 2.

TABLE 2

| | 0.3 g of MHO per m2 heat processing at | | 1.0 g of MHO per m2 heat processing at | |
|---|---|---|---|---|
| Binder | 120° C. | 140° C. | 120° C. | 140° C. |
| CSA | 2 | 2 | 4 | 4 |
| CAB | 2 | 1 | 3 | 4 |
| VC/VA | 1 | 2 | 4 | 3 |
| PVB | 2 | 2 | 2 | 2 |

The tests described in this Example 2 were repeated with the only difference that the optical density of the deposited bismuth barrier layer had been increased to 4.0 instead of the value 1.6. This measure resulted in an improved thermal diffusion of the hydrophobizing agent so that in all cases the 100th print had a perfect ink reception (value 4) and consequently showed a uniform black in the printed areas.

I claim:

1. Heat-sensitive imaging element comprising a support carrying in the given sequence a binder layer containing a binder, optionally an intermediate adhesive layer, and a barrier layer that is ablatable by a laser beam or permeabilizable under the influence of a laser beam, wherein said binder layer contains at least one hydrophobizing agent with a weight ratio to the binder in said binder layer being from 2:1 to 1:5 capable of diffusing under the influence of heat through holes made in said barrier layer or through permeabilized parts of said barrier layer and capable of reacting with the oleophobic surface of a printing plate precursor brought in face-to-face contact with said barrier layer.

2. A heat-sensitive .imaging element according to claim 1, wherein said barrier layer is a metal barrier layer.

3. A heat-sensitive imaging element according to claim 2, wherein the metal of said metal barrier layer is indium, tin, or bismuth.

4. A heat-sensitive imaging element according to claim 2 or 3, wherein said metal barrier layer has been applied by vapour deposition under vacuum.

5. A heat-sensitive imaging element according to claim 1, wherein said barrier layer is a polymer layer comprising substances capable of absorbing light emitted by a laser beam and converting it into heat.

6. A heat-sensitive imaging element according to claim 5, wherein said polymer barrier bayer is a layer containing a hardened silicone resin.

7. A heat-sensitive imaging element according to claim 1, wherein said barrier layer is covered with a protective layer.

8. A heat-sensitive imaging element according to claim 7, wherein said protective layer is removable integrally.

9. A heat-sensitive imaging element according to claim 7, wherein said protective layer—when said heat-sensitive imaging element has been image-wise exposed—is removable at the image-wise exposed areas by rubbing or tearing off.

* * * * *